United States Patent
Hwang et al.

(10) Patent No.: US 8,806,316 B2
(45) Date of Patent: Aug. 12, 2014

(54) CIRCUITS, INTEGRATED CIRCUITS, AND METHODS FOR INTERLEAVED PARITY COMPUTATION

(75) Inventors: Guorjuh Thomas Hwang, Sugar Land, TX (US); Chia Jen Chang, Sugar Land, TX (US)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 13/348,447

(22) Filed: Jan. 11, 2012

(65) Prior Publication Data
US 2013/0179758 A1    Jul. 11, 2013

(51) Int. Cl.
*G06F 11/00* (2006.01)
*H03M 13/00* (2006.01)

(52) U.S. Cl.
USPC ............ 714/801; 714/761; 714/762; 714/765

(58) Field of Classification Search
USPC .......................... 714/761, 762, 765, 770, 801
See application file for complete search history.

(56) References Cited

U.S. PATENT DOCUMENTS

| | | | |
|---|---|---|---|
| 4,450,561 A | 5/1984 | Gotze et al. | |
| 4,994,993 A | 2/1991 | Asghar et al. | |
| 5,208,490 A | 5/1993 | Yetter | |
| 5,673,419 A * | 9/1997 | Nisar | 703/28 |
| 5,727,003 A * | 3/1998 | Zook | 714/762 |
| 6,801,056 B2 | 10/2004 | Forbes | |
| 6,901,000 B1 | 5/2005 | Ichiriu et al. | |
| 7,246,259 B2 | 7/2007 | Subbarao et al. | |
| 7,840,876 B2 | 11/2010 | Sturm et al. | |
| 2006/0109712 A1 | 5/2006 | Conley et al. | |
| 2008/0168331 A1 | 7/2008 | Vogelsang et al. | |
| 2009/0158111 A1 | 6/2009 | Johnson | |
| 2011/0185119 A1 | 7/2011 | Madpuwar | |
| 2013/0117628 A1 | 5/2013 | Johnson | |
| 2014/0040696 A1 | 2/2014 | Johnson | |

OTHER PUBLICATIONS

Kidiyarova-Shevchenko, Anna Yu., et al., "RSFQ Asynchronous Serial Multiplier and Spreading Codes Generator for Multiuser Detector", IEEE Transactions on Applied Superconductivity, vol. 13, No. 2, Jun. 2003.

* cited by examiner

*Primary Examiner* — Sam Rizk
(74) *Attorney, Agent, or Firm* — Dorsey & Whitney LLP

(57) ABSTRACT

Circuits, integrated circuits, and methods are disclosed for interleaved parity computation. In one such example circuit, an interleaved parity computation circuit includes a first parity circuit that receives a first set of bits and a second parity circuit that receives a second set of bits. The first set of bits includes a first parity bit, and is received in the first parity circuit during a first clock cycle. The first parity circuit generates a first signal indicative of the parity of the first set of bits. The second set of bits includes a second parity bit, and is received in the second parity circuit during a second clock cycle. The second parity circuit generates a second signal indicative of the parity of the second set of bits. A combining circuit combines the first signal and the second signal into an alert signal.

28 Claims, 4 Drawing Sheets

CIRCUITS, INTEGRATED CIRCUITS, AND METHODS FOR INTERLEAVED PARITY COMPUTATION

TECHNICAL FIELD

Embodiments of the invention relate generally to integrated circuits, and more particularly, in one or more of the illustrated embodiments, to interleaved parity computation circuits.

BACKGROUND OF THE INVENTION

In integrated circuits, as electrical signals such as those representing binary digits (i.e., bits) are transmitted from one area to another, noise may be introduced on the transmission path which may alter the electrical signal. For example, a logical high bit (e.g., "1") sent from a memory controller may be received as a logical low bit (e.g., "0") at a memory, such as a dynamic random access memory ("DRAM"), if sufficient noise is introduced on the transmission path causing the bit to "flip." Also, even if no noise is introduced on the transmission path, a bit may be transmitted incorrectly due to other problems, such as errors in the sending or receiving circuits. Incorrectly transmitted bits may cause problems, such as system errors and incorrect memory commands, or such as data being stored incorrectly in a memory.

In order to mitigate the errors associated with incorrectly transmitted bits, error detection and/or error correction codes are often used. For example, a parity bit may be added to a set of bits in order to help detect errors in transmission of the bits. The set of bits may represent, among other things, an address, a command, a number, or other information (e.g., information to be stored in memory), or some combination of these. The set of bits may be referred to as a "word." A 22-bit word, for example, may include an address and multiple commands in some embodiments. Before the 22-bit word is transmitted, a sending circuit may generate a parity bit by, for example, XORing all of the bits in the word, and may add the parity bit to the word (thus making it 23-bits), usually at the end or at the beginning of the word. The full 23-bit word may then be transmitted.

The added parity bit may be an "even" type (which may be referred to as using even parity), or an "odd" type (which may be referred to as using odd parity). In even parity, the parity bit may be set to a logical high value if the original word (without the parity bit) has an odd number of logical high bits, thereby causing the total number of logical high bits in the word to be even. Causing the total number of logical high bits in a word to be even may facilitate subsequent checking of the word (e.g., after transmission) to determine if any of the bits "flipped" since the parity bit was generated. For example, when the word is received at a receiving circuit, the receiving circuit may check the parity of the received word (which includes the parity bit). If the received word has an even number of logical high bits, the parity of the word is even and thus "correct." If the received word has an odd number of logical high bits, the parity of the word is odd and thus "incorrect," which means that at least one bit was transmitted incorrectly.

In odd parity, the parity bit may be set to logical high if the original word (without the parity bit) has an even number logical high bits, thereby causing the total number of logical high bits in the word to be odd. Words transmitted using odd parity may similarly be checked at a receiving circuit by determining the parity of the word as received.

Although parity bits are not able to correct an incorrectly transmitted bit (because the parity bit cannot tell which bit was transmitted incorrectly), and although they are only able to detect single or other odd numbers of incorrectly transmitted bits (i.e., the parity of the received word will be "correct" if 2, 4, 6, etc. bits are transmitted incorrectly), they are an economical way of detecting some incorrectly transmitted bits. More complex error detection schemes (such as a cyclic redundancy code) may be used when more precision or error correction is needed, although these more complex schemes may require more processing and/or more bandwidth to transfer additional redundancy information.

As the operating frequency of an integrated circuit increases, the incidence of incorrectly transmitted bits may increase. Also, because the clock period shortens as the operating frequency increases, the time during which error detection operations (and in some cases error correction operations) need to complete may decrease. Even with a relatively simple error detection code such as a parity bit, the error detection operations may tend to limit the otherwise increasingly fast operating frequency of an integrated circuit, particularly for integrated circuits where a new word may be received every clock cycle (thereby requiring error detection operations to complete every clock cycle). Also, in some integrated circuits, the operating frequency of the circuit may be variable.

It may thus be desirable in some instances to decrease the parity latency (e.g., the amount of time required to check for incorrectly transmitted bits by determining the parity of a transmitted word). It may furthermore be desirable to asynchronously provide signals indicating the parity correctness or incorrectness, in addition to synchronously providing such information.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
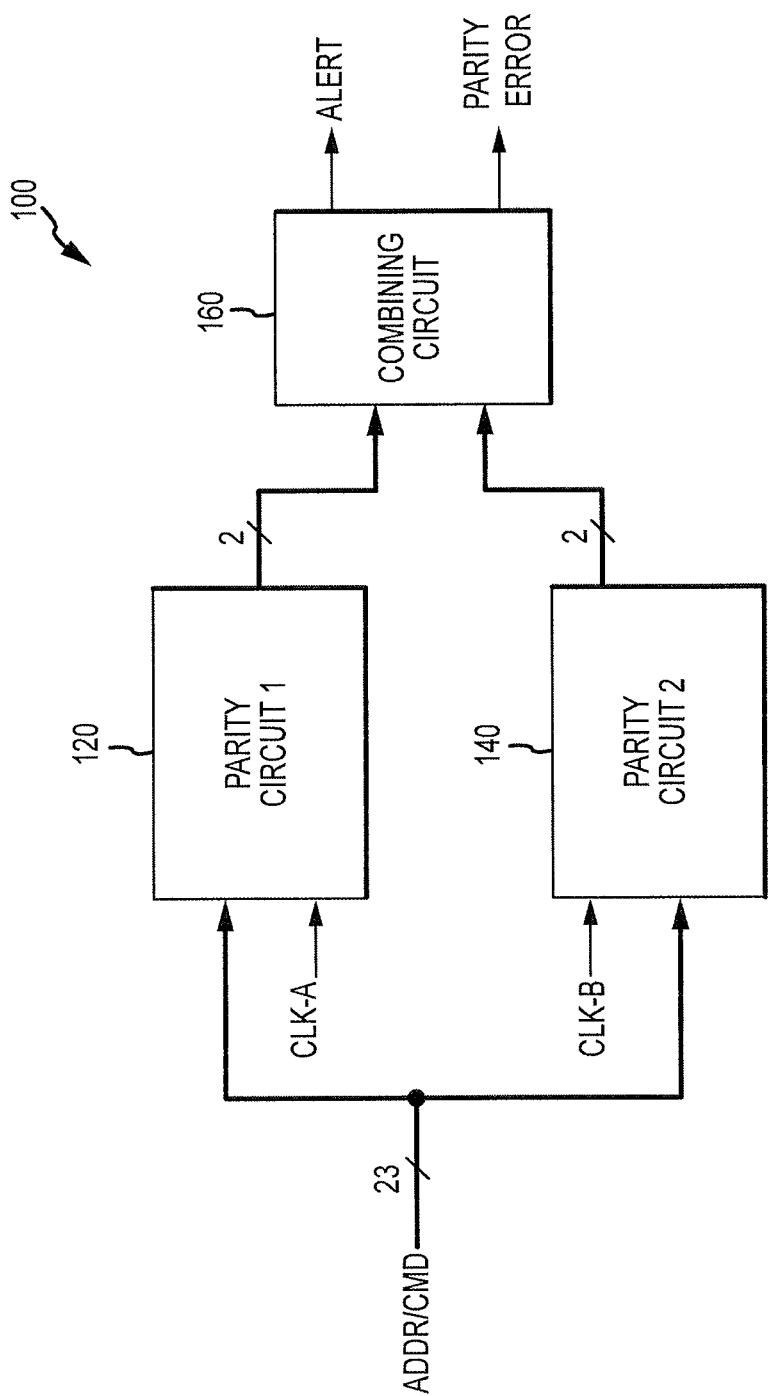
FIG. 1 is a block diagram of an interleaved parity computation circuit according to an embodiment of the present invention.

FIG. 1 illustrates an interleaved parity computation circuit 100 according to an embodiment of the invention. The interleaved parity computation circuit 100 may include a first parity circuit 120, a second parity circuit 140, and a combining circuit 160. The first and second parity circuits 120, 140 may both receive a set of bits. For example, the first and second parity circuits 120, 140 may be coupled at their inputs to a 23-bit ADDR/CMD bus, which may transmit words including address and/or command information, as well as a parity bit. The words transmitted on the ADDR/CMD bus may be generated in an apparatus such as a memory controller, and may be received by an interleaved parity computation circuit 100 on an apparatus such as a DRAM.

The words transmitted on the 23-bit ADDR/CMD bus illustrated in FIG. 1 may include, for example, 5 bits of command information, 17 bits of address information, and 1 parity bit in some embodiments. The bits of the command information may be represented by signals such as chip select, write enable, activate, row access strobe, column access strobe, and others, or any combination of these. The individual bits of the command information may be represented by dedicated signals (e.g., the bit in the most significant position is represented by a write enable signal), or the command information may be encoded such that the command bits collectively define a plurality of commands. The address information may include, for example, a bank address, a column address, a row address, or a combination of these. The parity bit for a particular word may be a bit generated by the source of the word based on the number of logical high bits in the command and address information, and may be included in the word.

Furthermore, the number of bits in words transmitted on the 23-bit ADDR/CMD bus illustrated in FIG. 1 that represent command information and the number of bits that represent address information may vary. For example, in some embodiments, such as in a memory, more address information may be needed for addressing a row than a column (because there may be more rows in the memory than columns), and so words transmitted on the ADDR/CMD bus may include 5 command bits, 17 address bits, and 1 parity bit when the address bits represent a row address. On the other hand, the words may include 8 command bits, 14 address bits, and 1 parity bit when the address bits represent a column address. One or more of the command bits, and/or additional control signals may indicate the format of the words transmitted on the ADDR/CMD bus. In still other embodiments, the entire word other than the parity bit (e.g., 22 bits for the example described above) may represent command information, or may represent one or more addresses. In general, the bits in the words transmitted on the ADDR/CMD bus may represent any type of information. Furthermore, other types of buses may be used, which may or may not include address and command information.

The first parity circuit 120 in FIG. 1 may receive words transmitted on the ADDR/CMD bus, and may also receive a CLK-A signal. The rising edge of the CLK-A signal may be a strobe signal indicating when a word on the ADDR/CMD bus should be received by the first parity circuit 120 (e.g., when the word on the ADDR/CMD bus is valid). Upon receiving the word from the ADDR/CMD bus, the first parity circuit 120 may generate one or more signals indicative of the parity of the received word. For example, the first parity circuit 120 may generate an asynchronous signal indicating whether parity of the received word is correct or incorrect. If the parity bit in the word was encoded with even parity, the parity of the received word may be determined to be correct if the received word has an even parity.

The first parity circuit 120 may also in some embodiments generate a synchronous signal indicative of the parity of the bits received via the ADDR/CMD bus that may, however, have a one or two clock period latency from the rising edge of the CLK-A signal. The asynchronous signal and/or the synchronous signal generated by the first parity circuit 120 may be provided to the combining circuit 160. As shown in FIG. 1, a 2-bit bus provides the asynchronous and synchronous signals to the combining circuit 160 from the first parity circuit 120.

The second parity circuit 140 in FIG. 1 may also receive words transmitted on the ADDR/CMD bus, and may receive a CLK-B signal. The rising edge of the CLK-B signal may be a strobe signal indicating when a word on the ADDR/CMD bus should be received by the second parity circuit 140 (e.g., when the word on the ADDR/CMD bus is valid). Upon receiving the word from the ADDR/CMD bus, the second parity circuit 140 may generate one or more signals indicative of the parity of the received word. For example, the second parity circuit 140 may generate an asynchronous signal indicating whether the parity of the received word is correct or incorrect. If the parity bit in the word was encoded with even parity, the parity of the received word may be determined to be correct if the received word has an even parity.

The second parity circuit 140 may also in some embodiments generate a synchronous signal indicative of the parity of the bits received via the ADDR/CMD bus, that may, however have a one or two clock period latency from the rising edge of the CLK-B signal. The asynchronous signal and/or the synchronous signal generated by the second parity circuit 140 may be provided to the combining circuit 160. As shown in FIG. 1, a 2-bit bus provides the asynchronous and synchronous signals to the combining circuit 160 from the second parity circuit 140.

In general, the first and second parity circuits 120, 140 may generate their respective signals indicative of the parity of the received words in any manner. For example, the first and second parity circuits 120, 140 may perform operations on the word received from the ADDR/CMD bus to determine the parity of the word. Taking an even parity example, the first parity circuit 120 may XOR all of the bits in the received word together in one or more stages of XOR gates. If there is an even number of logical high bits in the word (and thus the parity of the received word is correct), then the result of the XOR will be a logical low, and the first parity circuit 120 may output a logical low signal indicating that the parity of the received word is correct. If there is an odd number of logical high bits in the word (and thus the parity of the received word is incorrect), then the result of the XOR will be a logical high, and the first parity circuit 120 may output a logical high signal indicating that the parity of the received word is incorrect.

In other embodiments, however, the first and second parity circuits 120, 140 may generate their respective signals in a different manner. For example, the first parity circuit 120 may generate a new parity bit from the received word, compare the new parity bit with the parity bit transmitted as part of the word, and output a signal based on the comparison. The first and second parity circuits 120, 140 may also use any other method to generate the signals indicative of the parity of the received words. As described above, in some embodiments a logical low signal output from the first and second parity circuits 120, 140 may indicate that the parity of the respective received word was correct. A logical high signal may then indicate that the parity of the respective received word was incorrect, which may mean that at least one of the bits in the word was transmitted incorrectly. However, in other embodiments, a logical high signal may indicate that that the parity of the received word is correct, and a logical low signal may indicate that the parity of the received word is incorrect and therefore that at least one bit of the word was transmitted incorrectly.

The combining circuit 160 may combine the one or more signals generated by the first and second parity circuits 120, 140. For example, the combining circuit 160 may combine the asynchronous signal generated by the first parity circuit 120 with the asynchronous signal generated by the second parity circuit 140, and may provide an ALERT signal based at least in part on these two asynchronous signals. The ALERT signal may thus be an asynchronous signal that may indicate whether the parity of the words received by the first and second parity circuits 120, 140 was correct, or whether there was at least one bit that was transmitted incorrectly.

As explained in more detail below in connection with FIG. 4, the ALERT signal may be provided to the source of the word in order to alert the source of a transmission problem and, in some embodiments, commence an error handling procedure. Because the ALERT signal is asynchronous, as opposed to being synchronous, it may reduce the parity latency required to alert the source of the word of the problem as compared with a synchronous ALERT signal, which may allow the source of the word, in turn, to more quickly resend the word or commence the error handling procedure.

The combining circuit 160 may also combine the synchronous signal generated by the first parity circuit 120 with the synchronous signal generated by the second parity circuit 140, and may provide a PARITY ERROR signal based at least in part on these two synchronous signals. The PARITY ERROR signal may be used in processing the words received by the parity circuits 120, 140. For example, if the PARITY ERROR signal indicates that the parity of the received word is correct, then an apparatus incorporating the interleaved parity computation circuit 100 may process the word, such as by propagating the command and/or address information contained in the word to other parts of the apparatus. On the other hand, if the PARITY ERROR signal indicates that the parity of the received word is incorrect, then the PARITY ERROR signal may interrupt the internal command stream and may cause the apparatus incorporating the interleaved parity computation circuit 100 to discard the word instead of processing it, because at least one bit of the word was transmitted incorrectly.

Of course, as mentioned above, just because the parity of a received word is correct does not necessarily mean that all of the bits were transmitted correctly because should 2, 4, 6, etc. bits be transmitted incorrectly, the parity of the received word may still be correct, even though there were incorrectly transmitted bits. On the other hand, when a word has incorrect parity, this may always indicate that at least one of the bits in the word was transmitted incorrectly, although it could of course mean that more than one (i.e., 3, 5, 7, etc.) bit was transmitted incorrectly.

In some embodiments, rather than generating the PARITY ERROR signal by combining the synchronous signals from the first and second parity circuits 120, 140, the combining circuit may provide the asynchronous ALERT signal as the PARITY ERROR signal. This may allow an apparatus incorporating the interleaved parity computation circuit 100 to more quickly discard incoming words with incorrect parity, in order to, for example, give priority to words with correct parity.

In operation, the first and second parity circuits 120, 140 may interleave parity computation operations (e.g., may "ping-pong" successive parity bit computation for words to alternating parity circuits). The CLK-A signal provided to the first parity circuit 120 may have a rising edge for every other rising edge of a reference clock CLK (e.g., every even rising edge of the reference clock), while the CLK-B signal provided to the second parity circuit 140 may have a rising edge for every other alternative rising edge of the reference clock CLK (e.g., during odd rising edges of the reference clock). These CLK-A and CLK-B signal may be generated in a four-phase clock generator based on the reference clock CLK, and may have a frequency that is approximately half the frequency of the reference clock. The CLK-A and CLK-B signals may have a 50% duty cycle as compared with the reference clock CLK signal, or a 25% duty cycle as compared with the frequency of the respective CLK-A and CLK-B signals.

Still with reference to the operation of FIG. 1, at the reference clock's first rising edge or shortly thereafter, the CLK-A signal may have a rising edge and the first parity circuit 120 may receive (e.g., capture) a first word from the ADDR/CMD bus and begin parity computations to determine the parity of the received word. At the reference clock's second rising edge or shortly thereafter, the CLK-B signal may have a rising edge and the second parity circuit 140 may receive a second word from the ADDR/CMD bus and begin parity computations to determine the parity of the received word. The interleaved nature of the parity computation circuit 100 allows the second parity circuit 140 to receive the second word before the first parity circuit 120 has finished the parity computations. Furthermore, the first parity circuit 120 may receive a third word while the second parity circuit 140 is still performing the parity computations on the second word, and so forth.

In this manner, the interleaved parity computation circuit 100 allows up to two clock cycles for the parity circuits 120, 140 to complete the parity computations. This allows for the operating frequency of the reference clock CLK to be increased, even past the point where the clock period of the reference clock is shorter than the time required to determine the parity of a received word, while still allowing a parity computation to complete every clock cycle and also allowing the asynchronous ALERT signal to be propagated with a short parity latency. In FIG. 1, the ALERT signal may be propagated to the source of the word as soon as the parity computation is complete, without needing to wait for a synchronous element (e.g., a latch). Furthermore, the interleaved parity computation circuit 100 is flexible in that it allows parity computation times to also be less than one period of the reference clock CLK while still allowing the asynchronous ALERT signal to be provided as soon as or shortly after the parity computation is complete.

In general, the amount of time it takes for a parity computation to be completed may be less than, or up to two times greater than the clock period of the reference clock CLK. Furthermore, although FIG. 1 only illustrates a first parity circuit 120 and a second parity circuit 140, additional parity circuits may be added to the interleaved parity computation circuit 100. For example, a third and a fourth parity computation circuit (not shown) may allow flexibility in that the amount of time needed for a parity computation could be less than, or up to four times greater than the clock period of the reference clock, which may allow for even greater reference clock frequencies to be used as compared with interleaved parity computation circuits with only first and second parity circuits 120, 140. In general any number of parity circuits may be used in the interleaved parity computation circuit 100.

With reference now to the schematic diagram illustrated in FIG. 2 and the timing diagram illustrated in FIG. 3, an embodiment of an interleaved parity computation circuit 200 will now be described. The interleaved parity computation circuit 200 may include a first parity circuit 220, a second parity circuit 240, and a combining circuit 260, which may in some embodiments be similar to the first parity circuit 120, the second parity circuit 140, and the combining circuit 160, respectively, illustrated in the block diagram of FIG. 1. Furthermore the CLK-1 and CLK-3 signals in FIGS. 2 and 3 may in some embodiments correspond to the CLK-A and CLK-B signals in FIG. 1.

Figure 2:
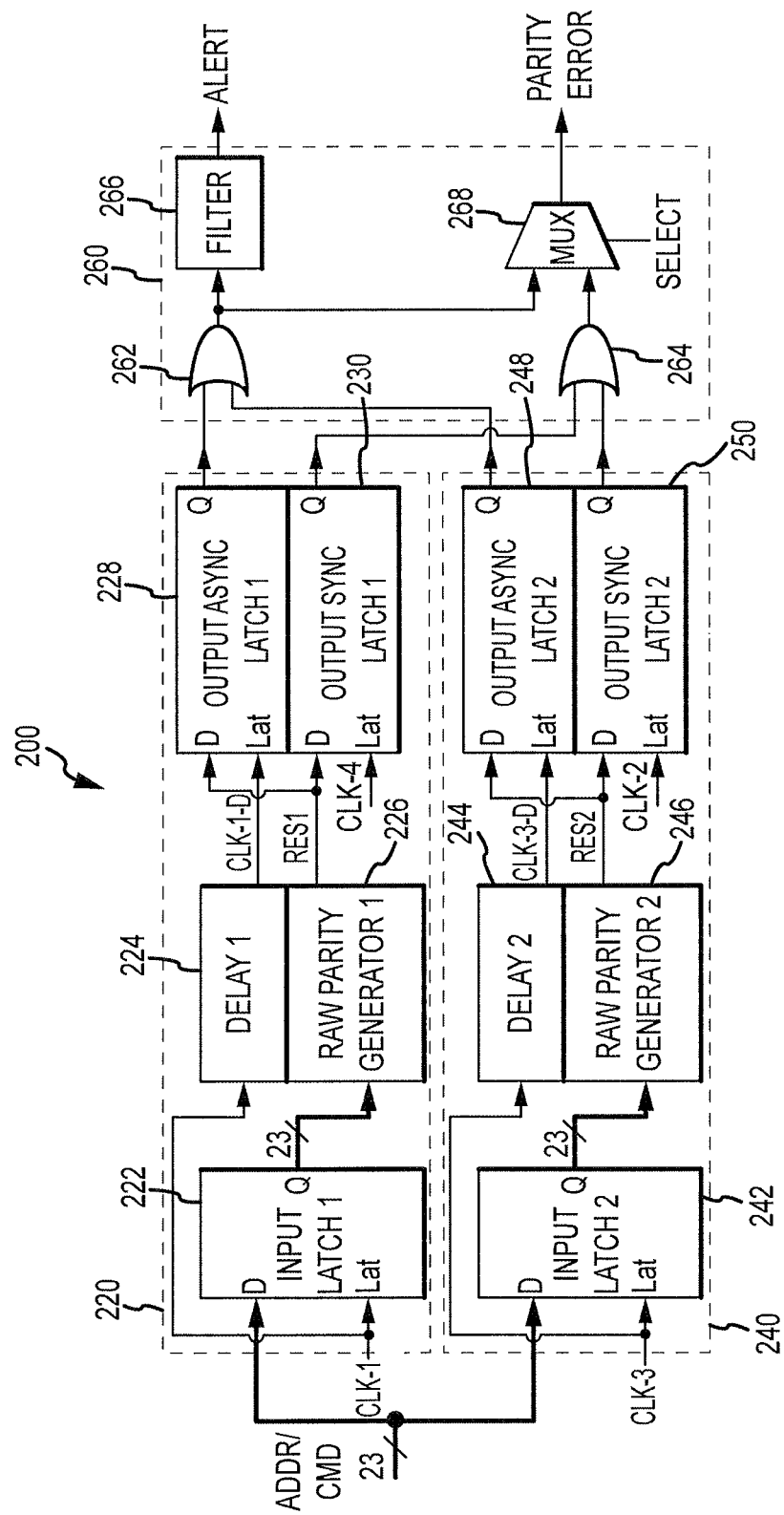
FIG. 2 is a schematic diagram of an interleaved parity computation circuit according to an embodiment of the invention.

The first parity circuit 220 illustrated in FIG. 2 includes a first input latch 222, a first delay element 224, a first raw parity generator 226, a first output asynchronous latch 228, and a first output synchronous latch 230. The first input latch 222 may receive words from the ADDR/CMD bus as its input, may receive a CLK-1 signal as its latching signal input, and may propagate the words latched from the ADDR/CMD bus as its output.

The CLK-1 signal may be generated in a four-phase clock generator (not shown) based at least in part on a reference clock CLK signal. As shown in FIG. 3, the CLK-1 signal may have a frequency approximately half the frequency of the reference clock CLK signal, but may be active for the same amount of time (e.g., the CLK-1 signal may only have approximately a 25% duty cycle as compared with the frequency of the CLK-1 signal). The four-phase clock generator may also generate signals CLK-2, CLK-3, CLK-4. The signals CLK-2, CLK-3, and CLK-4 may each have the same frequency and duty cycle as the CLK-1 signal, but each of these signals may have a different phase. For example, the CLK-2 signal may be 90 degrees out of phase with the CLK-1 signal, the CLK-3 signal may be 90 degrees out of phase with the CLK-2 signal and 180 degrees out of phase with the CLK-1 signal, and the CLK-4 signal may be 90 degrees out of phase with the CLK-3 signal and 270 degrees out of phase with the CLK-1 signal.

Each of the CLK-1, CLK-2, CLK-3, and CLK-4 signals may correspond to an edge of the reference clock CLK signal. For example, as shown in FIG. 3, the CLK-1 signal may correspond to a first rising edge of the CLK signal, the CLK-2 signal may correspond to a first falling edge of the CLK signal, the CLK-3 signal may correspond to a second rising edge of the CLK signal, and the CLK-4 signal may correspond to a second falling edge of the CLK signal. In general, the CLK-1, CLK-2, CLK-3, and CLK-4 signals may be slightly delayed as compared with the edge of the reference clock CLK signal with which they respectively correspond. For example, as shown in FIG. 3, the rising edge of the CLK-1 signal may be generated with a phase generator delay latency 302 from the reference clock CLK, and the CLK-3 signal may be generated with a phase generator delay latency 306 from the reference clock CLK, with the CLK-2 and CLK-4 signals being similarly delayed with respect to the reference clock CLK.

The first input latch 222 may be transparent in that when the latching signal (i.e. CLK-1 in FIG. 2) is asserted, the latch 222 may receive the word currently present on the ADDR/CMD bus and propagate this word to its output (possibly with a small delay), but when the latching signal is not asserted, the latch 222 may hold the most recent word received from the ADDR/CMD bus when the latching signal was last asserted. The first input latch 222 may be coupled to the first raw parity generator 226 in that the output of the first input latch 222 may be provided to the input of the raw parity generator 226.

The raw parity generator 226 may compute the parity of the word from the first input latch 222, and generate a result signal RES1 indicative of the parity of the word. As described above, the RES1 signal may, for example, be a logical low signal if the parity of the word is correct (e.g., if even parity was used to encode the parity bit and the received word has even parity), and a logical high if the parity of the word is incorrect (e.g., if even parity was used to encode the parity bit and the received word has odd parity). An incorrect parity for a word may indicate that one or more bits in the word were transmitted incorrectly. The raw parity generator 226 may generate the RES1 signal by, for example, XORing the bits of the word together in one or more stages of XOR gates. For example, for a 23-bit word (including the parity bit) as illustrated in FIG. 2, the raw parity generator 226 may include 3 stages of XOR-2 gates and 1 stage of an XOR-3 gate. Of course other implementations are possible for the raw parity generator 226.

Some embodiments of the raw parity generator 226 may not include any sequential circuit elements (e.g., latches or flip-flops) but may instead include only combinatorial circuit elements (such as XOR gates). In these embodiments, the raw parity generator 226 may be able to provide an asynchronous RES1 signal with latency only dependent on the combinatorial circuit elements (after the input latch 222), or in other words, may operate asynchronously. Furthermore, in these embodiments, the raw parity generator 226 may consume a relatively low amount of power because no clock signal will need to be routed to the raw parity generator 226 for sequential circuit elements. In other embodiments of the raw parity generator 226, however, one or more sequential circuit elements may be used. The asynchronous RES1 signal of the first raw parity generator 226 may be provided to the inputs of the first output asynchronous latch 228 and the first output synchronous latch 230.

The CLK-1 signal provided as the latching signal to the first input latch 222 may also be provided to the first delay element 224. The first delay element 224 may mimic the latency encountered by a word as it propagates through the first input latch 222 and/or the first raw parity generator 226 by delaying the CLK-1 signal by a delay 304. Accordingly, the output CLK-1-D of the first delay element 224 may approximately correspond to the time at which the raw parity generator 226 has completed the parity computations on the word received by the first parity circuit 220. In some embodiments, the delay 304 added by the first delay element 224 may be slightly more than the time needed for the parity computation in the raw parity generator 226, such as one additional gate delay, in order to increase timing margin.

The output CLK-1-D of the first delay element 224 may be provided as the latching signal to the first output asynchronous latch 228. In this manner, the first output asynchronous latch 228 may provide an asynchronous output signal indicative of the parity of the word received by the first parity circuit 220 as soon as the parity computation is completed, or shortly thereafter. The first output asynchronous latch 228 may, however, slightly delay the output signal due to the inherent gate delays that may be present within the first output asynchronous latch 228. Also, the CLK-4 signal generated by the four-phase clock generator (not shown) discussed above may be provided as the latching signal to the first output synchronous latch 230. In this manner, the first output synchronous latch 230 may provide a synchronous output signal at the rising edge of the CLK-4 signal, or shortly thereafter, with the signal indicative of the parity of the word received by the first parity circuit 220. In some embodiments, the first output asynchronous latch 228 and the first output synchronous latch 230 may be transparent latches, as described above in more detail with reference to the first input latch 222, or may be any other type of latch.

As shown in FIG. 2, a second parity circuit 240 may include a second input latch 242, a second delay element 244, a second raw parity generator 246, a second output asynchronous latch 248, and a second output synchronous latch 250. In general, these elements 242, 244, 246, 248, 250 of the second parity circuit 240 may be generally analogous to the respective corresponding elements 222, 224, 226, 228, 230 in the first parity circuit 220, except that the second input latch receives the CLK-3 signal as its latching signal, the raw parity generator 246 generates a result signal RES2, the second output asynchronous latch receives the CLK-3-D as its latching signal, and the second output synchronous latch receives the CLK-2 signal as its latching signal.

The combining circuit 260 shown in FIG. 2 may combine one or more of the output signals from the output latches 228, 230, 248, 250 from the first and second parity circuits 220, 240 into one or more signals. For example, the combing circuit may include an OR gate 262 (or, alternatively a NOR gate followed by an inverter, or some other configuration of gate or gates) that combines the output from the first output asynchronous latch 228 and the output from the second output asynchronous latch 248. The output of the OR gate 262 may in some embodiments be filtered by a filter 266 in order to, for example, remove glitches, although in other embodiments no filter is used. The output of the OR gate 262 or the filter 266 (if a filter is used) may be an asynchronous ALERT signal that may be used to inform the source of the word that one or more bits in a word were transmitted incorrectly. In embodiments where only combinatorial circuit elements are used in the first and second raw parity generators 226, 246, the ALERT signal may be asynchronously generated because after either or both input latches 222, 242 latch a word from the ADDR/CMD bus using a rising edge of the CLK-1 or CLK-3 signal (and the rising edge of the CLK-1 and/or CLK-3 signal propagates through the appropriate delay element 224, 244), the ALERT signal may be generated without any further clock signal transitions.

The combining circuit 260 may also include an additional OR gate 264 (or some other configuration of gate or gates) that combines the output from the first output synchronous latch 230 and the output from the second output synchronous latch 250. The output of the OR gate 264 may provide a synchronous signal that may be used to interrupt the internal command stream of an integrated circuit implementing the interleaved parity computation circuit 100. In some embodiments, the combining circuit 260 also includes a multiplexer 268 that may allow a PARITY ERROR signal to be based on the asynchronous signal provided by the OR gate 262 or alternatively to be based on the synchronous signal provided by the additional OR gate 264, with a selection being made by means of a select signal SELECT. The multiplexer 268 may allow flexibility in the processing of words on an apparatus that incorporates an interleaved parity computation circuit 200. Other embodiments of the combining circuit 260, however, may not include such a multiplexer.

In operation, the interleaved parity computation circuit 200 may receive a word from the ADDR/CMD bus at every clock cycle of the reference clock CLK, and may interleave (e.g., ping-pong) the parity computations for successive words between the first and second parity circuits 220, 240, similar to the interleaved parity computation circuit 100 described above.

Figure 3:
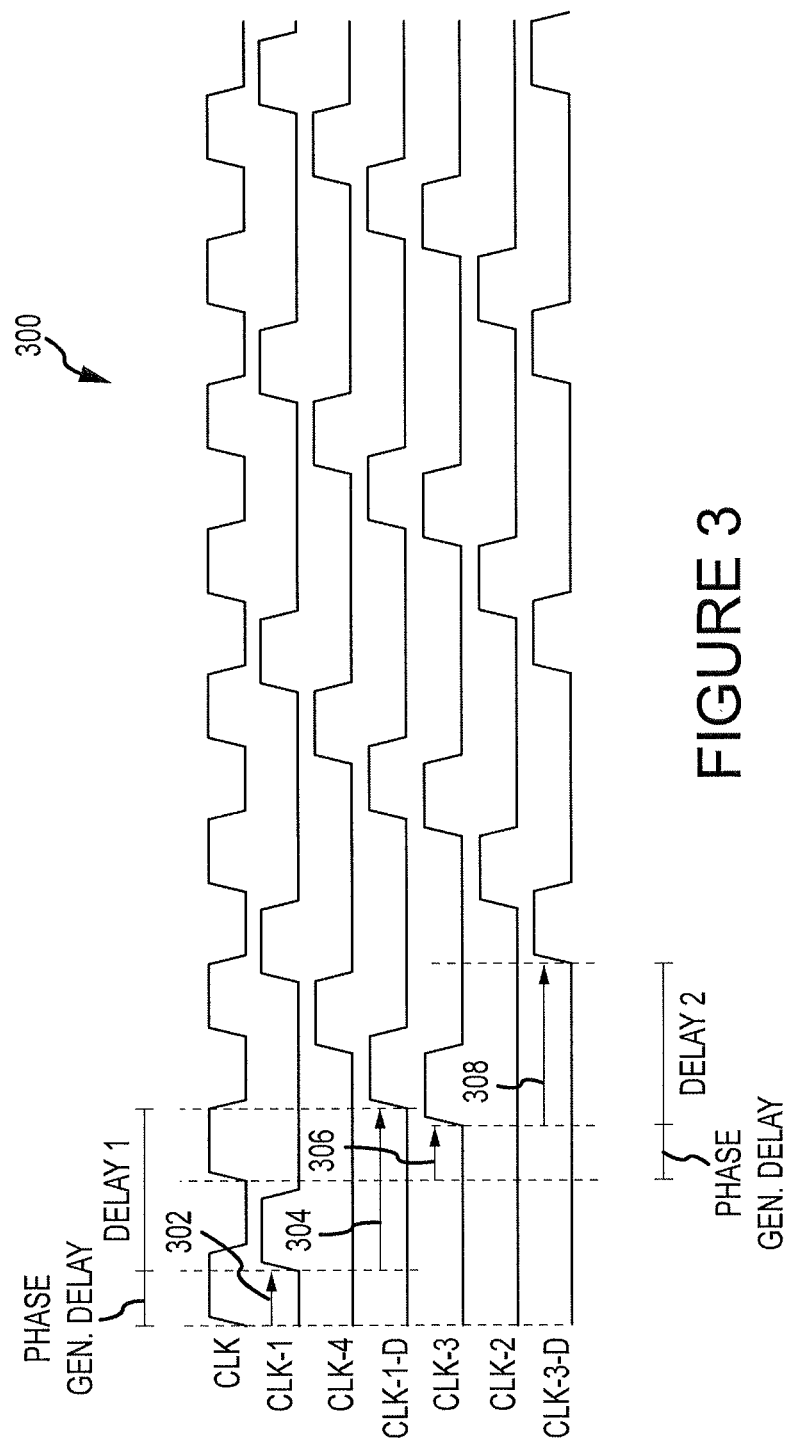
FIG. 3 is a timing diagram for the interleaved parity computation circuit of FIG. 2 according to an embodiment of the invention.

As shown in FIG. 3, the reference clock CLK signal is provided to a four-phase clock generator (not shown) which generates the CLK-1, CLK-2, CLK-3, and CLK-4 signals, each 90 degrees out of phase with one another. With continuing reference to FIGS. 2 and 3, at the first rising edge of the CLK-1 signal in FIG. 3, the first input latch 222 may receive a first word from the ADDR/CMD bus and provide that word to the first raw parity generator 226. The first word may correspond to the first rising edge of the reference clock CLK signal; for example, the source of the word may provide a word on the ADDR/CMD bus during or shortly after each rising edge of the reference clock CLK. The first raw parity generator 226 may check the parity of the received first word, and provide a RES1 signal indicative of the parity of the received first word to the inputs of the first output asynchronous latch 228 and the first output synchronous latch 230. The RES1 signal may indicate, for example, whether the parity of the received first word is correct or incorrect. The RES1 signal is provided to the input of the first output asynchronous latch 228, which receives the RES1 signal at the rising edge of the CLK-1-D signal or shortly thereafter, which occurs after the rising edge of the CLK-1 signal propagates through the first delay element 224. The RES1 signal is also received in the first output synchronous latch 230 at the rising edge of the CLK-4 signal or shortly thereafter, which may be after the rising edge of the CLK-1-D signal.

However, before the rising edge of the CLK-4 signal, at the first rising edge of the CLK-3 signal in FIG. 3, the second input latch may receive a second word from the ADDR/CMD bus and provide that word to the second raw parity generator 246. The second word may correspond to the second rising edge of the reference clock CLK signal. The second raw parity generator 246 may check the parity of the received second word, and provide a result signal RES2 indicative of the parity of the received second word to the inputs of the second output asynchronous latch 248 and the second output synchronous latch 250. The RES2 signal may indicate, for example, whether the parity of the received first word is correct or incorrect. The RES2 signal is provided to the input of the first output asynchronous latch, which receives the RES2 signal at the rising edge of the CLK-3-D signal or shortly thereafter, which occurs after the rising edge of the CLK-3 signal propagates through the second delay element 244. The RES2 signal is also received in the second output synchronous latch 250 at the rising edge of the CLK-2 signal, which may after the rising edge of the CLK-3-D signal.

As described above, the outputs of the latches 228, 230, 248, 250 are processed in the combining circuit 260, such as by combining the asynchronous output signals and/or the synchronous output signals.

In this manner, the first and second parity circuits 220, 240 check the parity of alternating words received on the ADDR/CMD bus, with each parity circuit taking up to two reference clock CLK cycles to compute the parity, but the two parity circuits 220, 240 collectively receiving a word at every clock cycle of the reference clock CLK and providing a signal indicative of the parity of a word at every clock cycle of the reference clock CLK, although the signal indicative of the parity of the word may have a slight latency of up to two clock cycles of the reference clock CLK.

Figure 4:
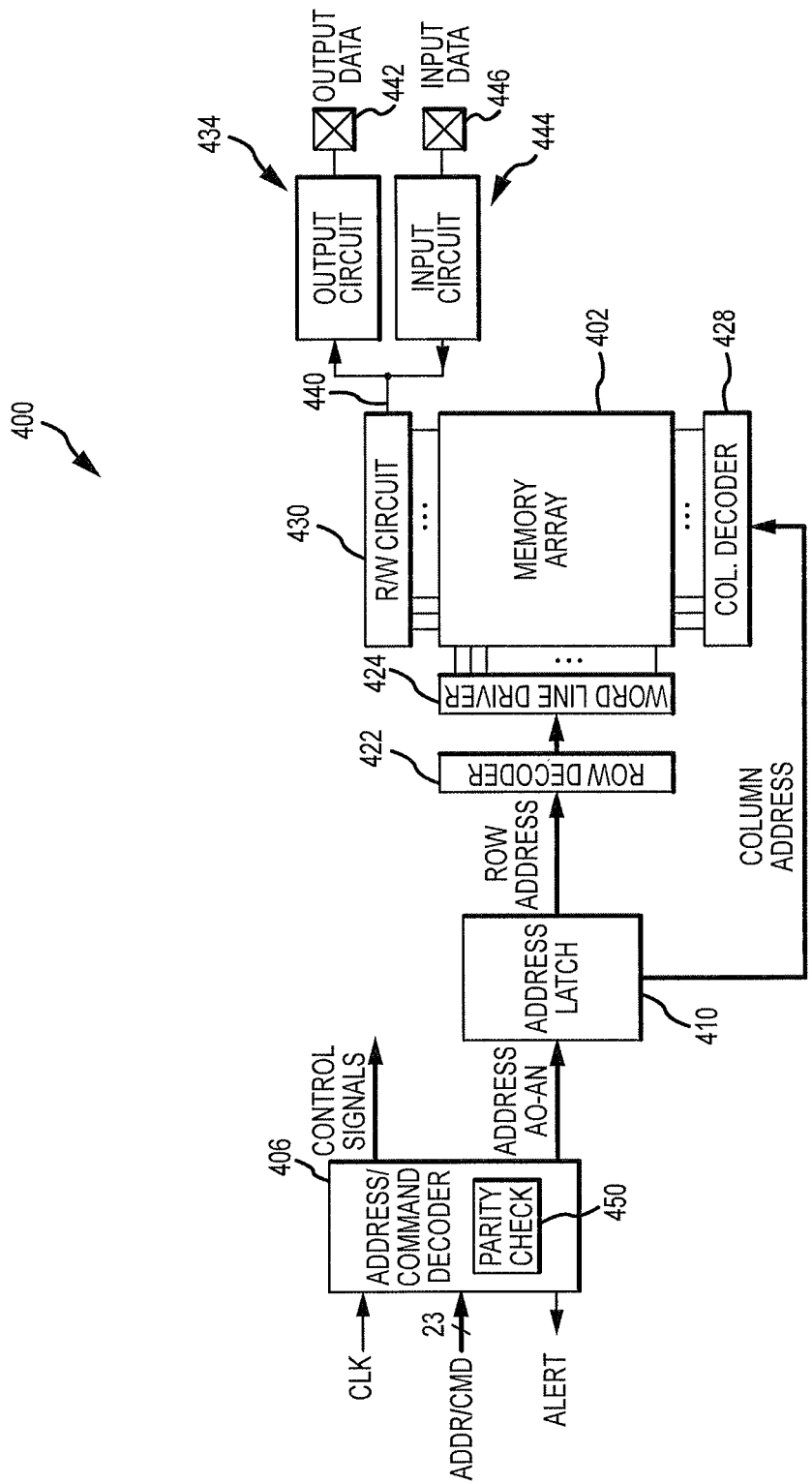
FIG. 4 is a block diagram of a memory having an interleaved parity computation circuit according to an embodiment of the invention.

FIG. 4 illustrates a portion of a memory 400 according to an embodiment of the present invention. The memory 400 includes an array 402 of memory cells, which may be, for example, DRAM memory cells, SRAM memory cells, flash memory cells, or some other types of memory cells. The memory 400 includes an address/command decoder 406 that receives memory commands and addresses through an ADDR/CMD bus, which may be 23 bits wide, one bit of which may be a dedicated parity bit. The address/command decoder 406 generates control signals, based on the commands received through the ADDR/CMD bus. The address/command decoder 406 also provides row and column addresses to the memory 400 through an address bus and an address latch 410. The address latch then outputs separate column addresses and separate row addresses.

The address/command decoder 406 in FIG. 4 also includes an interleaved parity computation circuit 450 that checks the parity of words received from the ADDR/CMD bus. Before sending a word to memory 400, a memory controller (not shown) may generate a parity bit for 22 bits of address and/or command information, and may append or otherwise include the parity bit with the other 22 bits, thus making words with 23 bits (although in other embodiments, the memory controller may send 22-bit words on one bus and individual parity bits separately on a dedicated parity line). Each 23-bit word may be sent by the memory controller and received at the address/command decoder 406 of the memory 400. The address/command decoder 406 may provide each 23-bit word (including the parity bit) to the interleaved parity computation circuit 450, which may interleavingly check the parity of each of the words with at least a first and second parity circuit, as described above. If the interleaved parity computation circuit 450 determines that the parity is correct for a particular received word, the address/command decoder 406 processes the word, which may include providing control signals to the memory 400 and/or providing column and/or row addresses to the memory 400. In some embodiments, the address/command decoder 406 may pre-decode the word in anticipation that the parity will be determined to be correct, at which point the address/command decoder 406 can immediately provide the control signals and/or addresses. In other embodiments, however, the word is not predecoded, and the address/command decoder 406 waits to decode the word until after the interleaved parity computation circuit has checked the parity of the word.

If the interleaved parity computation circuit 450 determines that the parity of a received word is incorrect and thus at least one bit in the word may have been transmitted incorrectly, the interleaved parity computation circuit 450 may cause the address/command decoder to generate an ALERT signal to notify the memory controller about the problem. The ALERT signal may, in some embodiments, be an asynchronous signal, as described in detail above.

The row and column addresses are provided by the address latch 410 to a row address decoder 422 and a column address decoder 428, respectively. The column address decoder 428 selects bit lines extending through the array 402 corresponding to respective column addresses. The row address decoder 422 is connected to word line driver 424 that activates respective rows of memory cells in the array 402 corresponding to received row addresses. The selected data line (e.g., a bit line or bit lines) corresponding to a received column address are coupled to a read/write circuitry 430 to provide read data to a data output circuit 434 via an input-output data bus 440. An output pad 442 coupled to the data output circuit 434 is used for electrically coupling to the memory 400. Write data are provided to the memory array 402 through a data input circuit 444 and the memory array read/write circuitry 430. An input pad 446 coupled to the data input circuit 442 is used for electrically coupling to the memory 400. The address/command decoder 406 responds to memory commands and addresses provided to the ADDR/CMD bus to perform various operations on the memory array 402. In particular, the address/command decoder 406 is used to generate internal control signals to read data from and write data to the memory array 402.

From the foregoing it will be appreciated that, although specific embodiments of the invention have been described herein for purposes of illustration, various modifications may be made without deviating from the spirit and scope of the invention. For example, FIGS. 1, 2, and 4 illustrate embodiments of circuits that include interleaved parity computation circuits 100, 200, 450. However, the interleaved parity computation circuits are not limited to having the same design, and may be of different designs and include different circuitry from one another.

Also, although the interleaved parity computation circuit 200 of FIG. 2 has been described as receiving a word from the ADDR/CMD bus on the rising edge of every clock cycle of the reference clock CLK, the interleaved parity computation circuit 200 (and/or the interleaved parity computation circuit 100) may receive more or less than one word per clock cycle of the reference clock CLK. For example, if a word is provided on the ADDR/CMD bus at every edge of the reference clock CLK (rather than just on the rising edges), the interleaved parity computation circuit 200 may be modified to have a third and fourth parity circuits in addition to the first and second parity circuits 220, 240, and the four parity circuits may be driven by an eight-phase clock generator. Other modifications are also possible, such as for the cases where a word is only provided on the ADDR/CMD bus at the rising edge of every other clock cycle, or if words are provided irregularly on the ADDR/CMD bus, including if they are provided asynchronously on the ADDR/CMD bus.

Also, although the words on the ADDR/CMD bus has been described as including both an address portion and a command portion, with a parity bit indicating the parity of the entire word, the parity bit may in some embodiments only indicate the parity of the address portion of the word, or only the parity of the command portion of the word. Also, although the above description describes parity bits in connection with transmittal of words across a bus, an interleaved parity computation circuit may also be used to check parity bit or other error detection or error correction codes in other implementations. Accordingly, the invention is not limited except as by the appended claims.

What is claimed is:

1. An interleaved parity computation circuit, comprising:
a first parity circuit configured to receive a first set of bits including a first parity bit during a first clock cycle and generate a first asynchronous signal indicative of the parity of the first set of bits, the first parity circuit including a first input latch coupled to a first parity generator, the first parity generator coupled to a first asynchronous latch configured to provide the first asynchronous signal, the first parity generator configured to check the parity of the first set of bits and provide a first result to the first asynchronous latch;
a second parity circuit distinct from the first parity circuit and configured to receive a second set of bits including a second parity bit during a second clock cycle and generate a second asynchronous signal indicative of the parity of the second set of bits, the second parity circuit including a second input latch coupled to a second parity generator, the second parity generator coupled to a second asynchronous latch configured to provide the second asynchronous signal, the second parity generator configured to check the parity of the second set of bits and provide a second result to the second asynchronous latch; and
a combining circuit coupled to the first and second parity circuits and configured to provide a signal, based at least in part on the first and second asynchronous signals, indicative of whether the parity of at least one of the first and second set of bits was incorrect.

2. The interleaved parity computation circuit of claim 1, wherein the first asynchronous signal indicates whether the parity of the first set of bits is correct.

3. The interleaved parity computation circuit of claim 2, wherein the first asynchronous signal is configured to be a logical low when the parity of the first set of bits is correct.

4. The interleaved parity computation circuit of claim 2, wherein whether the parity of the first set of bits is correct is based at least in part on whether the first set of bits was transmitted incorrectly.

5. The interleaved parity computation circuit of claim 1, wherein the second parity circuit is configured to receive the second set of bits before the first parity circuit generates the first asynchronous signal.

6. The interleaved parity computation circuit of claim 1, wherein the first parity circuit is configured to also generate a first synchronous signal indicative of the parity of the first set of bits and the second parity circuit is configured to also generate a second synchronous signal indicative of the parity of the second set of bits.

7. The interleaved parity computation circuit of claim 6, wherein the combining circuit is configured to also combine the first and second synchronous signals into a parity error signal.

8. An integrated circuit, comprising:
a first parity check circuit comprising a first input latch coupled to a first parity generator, the first parity generator also coupled to a first asynchronous latch and to a first synchronous latch, the first parity generator configured to check the parity of a first command/address word and provide a first result to the first asynchronous latch and the first synchronous latch;
a second parity check circuit comprising a second input latch coupled to a second parity generator, the second parity generator also coupled to a second asynchronous latch and a second synchronous latch, the second parity generator configured to check the parity of a second command/address word and provide a second result to the second asynchronous latch and the second synchronous latch;
a first logic circuit coupled to the first and second parity check circuits, configured to combine a first output from the first asynchronous latch and a second output from the second asynchronous latch and provide an asynchronous alert signal in response to the first and second outputs; and
a second logic circuit also coupled to the first and second parity check circuits, configured to combine a third output from the first synchronous latch and a fourth output from the second synchronous latch and provide a synchronous parity error signal in response to the third and fourth outputs,
wherein the first output is based at least in part on the first result and the second output is based at least in part on the second result.

9. The integrated circuit of claim 8, wherein the first command/address word comprises address and command information.

10. The integrated circuit of claim 8, wherein the first logic circuit comprises an OR gate that receives the first and second outputs and generates the alert signal.

11. The integrated circuit of claim 8, further comprising a delay element coupled between the first input latch and the first asynchronous latch and configured to delay a latching signal input to the first asynchronous latch by a fixed delay.

12. The integrated circuit of claim 11, wherein the fixed delay is based at least in part on a latency delay of the first parity generator.

13. The integrated circuit of claim 12, wherein the latency delay is a first latency delay, and the fixed delay is also based on a second latency delay of the first input latch.

14. The integrated circuit of claim 8, further comprising a four-phase clock generator that generates a first signal for use as the latching signal of the first input latch, a second signal for use as the latching signal of the second input latch, a third signal for use as the latching signal of the first synchronous latch, and a fourth signal for use as the latching signal of the second synchronous latch.

15. The integrated circuit of claim 8, wherein the first and second parity generators comprise XOR gates.

16. The integrated circuit of claim 15, wherein the first and second parity generators do not comprise any sequential circuit elements.

17. The integrated circuit of claim 8, wherein the first and second parity generators comprise only combinatorial circuit elements.

18. The integrated circuit of claim 17, wherein the first and second parity generators operate asynchronously.

19. A method, comprising:
receiving a first set of bits at a first parity circuit during a first clock cycle, the first set of bits including a first parity bit;
checking the parity of the first set of bits in the first parity circuit to determine whether the first set of bits was transmitted correctly;
outputting a first result of the checking the parity of the first set of bits as a first output signal;
receiving a second set of bits at a second parity circuit during a second clock cycle, the second set of bits including a second parity bit, and the second clock cycle being after the first clock cycle;
checking the parity of the second set of bits in the second parity circuit to determine whether the second set of bits was transmitted correctly; and
outputting a second result of the checking the parity of the second set of bits as a second output signal.

20. The method circuit of claim 19, further comprising receiving a third set of bits at the first parity circuit during a third clock cycle, the third clock cycle being after the second clock cycle.

21. The method circuit of claim 19, wherein the second set of bits is received at the second parity circuit before the result of the checking the parity of the first set of bits is output.

22. The method circuit of claim 19, further comprising latching the first result in a first asynchronous output latch and latching the second result in a second asynchronous output latch.

23. The method circuit of claim 19, wherein the receiving the first set of bits comprises latching the first set of bits in an input latch.

24. An interleaved parity computation circuit, comprising:
a first parity circuit configured to receive a first set of bits including a first parity bit during a first clock cycle and generate a first synchronous signal indicative of the parity of the first set of bits, the first parity circuit including a first input latch coupled to a first a first generator, the first parity generator coupled to a first synchronous latch configured to provide the first synchronous signal, the first parity generator configured to check the parity of the first set of bits and provide a first result to the first synchronous latch;
a second parity circuit distinct from the first parity circuit and configured to receive a second set of bits including a second parity bit during a second clock cycle and generate a second synchronous signal indicative of the parity of the second set of bits, the second parity circuit including a second input latch coupled to a second parity generator, the second parity generator coupled to a second synchronous latch configured to provide the second synchronous signal, the second parity generator configured to check the parity of the second set of bits and provide a second result to the second synchronous latch; and a combining circuit coupled to the first and second parity circuits and configured to provide a parity error signal indicative of whether the parity of at least one of the first and second set of bits was incorrect, the parity error signal selectively based on the first and second synchronous signals.

25. The interleaved parity computation circuit of claim 24, wherein the first parity circuit is configured to also generate a first asynchronous signal indicative of the parity of the first set of bits, the second parity circuit is configured to also generate a second asynchronous signal indicative of the parity of the second set of bits, and the combing circuit is configured to generate an alert signal based on the first and second asynchronous signals.

26. The interleaved parity circuit of claim 25, wherein the combining circuit is further configured to selectively provide the alert signal as the parity error signal.

27. The interleaved parity circuit of claim 25, further comprising a filter to filter the alert signal.

28. The interleaved parity computation circuit of claim 24, wherein the first and second parity bits are set using even parity.

* * * * *

UNITED STATES PATENT AND TRADEMARK OFFICE
CERTIFICATE OF CORRECTION

PATENT NO. : 8,806,316 B2  
APPLICATION NO. : 13/348447  
DATED : August 12, 2014  
INVENTOR(S) : Guorjuh Thomas Hwang et al.

Page 1 of 1

It is certified that error appears in the above-identified patent and that said Letters Patent is hereby corrected as shown below:

In the Claims

Column 14, line 58, in Claim 24, delete "a first a first" and insert -- a first parity --, therefor.
Column 15, line 20, in Claim 25, delete "combing" and insert -- combining --, therefor.

Signed and Sealed this
Eleventh Day of November, 2014

Michelle K. Lee
*Deputy Director of the United States Patent and Trademark Office*